US008735194B2

(12) United States Patent
Takahashi et al.

(10) Patent No.: US 8,735,194 B2
(45) Date of Patent: May 27, 2014

(54) METHOD OF MANUFACTURING DISPLAY APPARATUS

(75) Inventors: Kenji Takahashi, Yokohama (JP); Masafumi Sano, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 440 days.

(21) Appl. No.: 12/673,123

(22) PCT Filed: Oct. 1, 2008

(86) PCT No.: PCT/JP2008/068259
§ 371 (c)(1), (2), (4) Date: Feb. 11, 2010

(87) PCT Pub. No.: WO2009/051041
PCT Pub. Date: Apr. 23, 2009

(65) Prior Publication Data
US 2012/0142131 A1 Jun. 7, 2012

(30) Foreign Application Priority Data

Oct. 19, 2007 (JP) .................................. 2007-272540

(51) Int. Cl.
*H01L 21/00* (2006.01)
(52) U.S. Cl.
USPC ................... 438/34; 438/30; 438/39; 438/59; 438/66; 438/158; 257/67; 257/69; 257/71; 257/E33.001; 257/E31.105
(58) Field of Classification Search
None
See application file for complete search history.

(56) References Cited

U.S. PATENT DOCUMENTS

| 6,500,768 | B1 * | 12/2002 | Shields et al. ............... 438/738 |
| 7,772,049 | B2 * | 8/2010 | Hoffman et al. ............. 438/149 |
| 7,855,503 | B2 | 12/2010 | Suh et al. |
| 2002/0132383 | A1 | 9/2002 | Hiroki et al. .................... 438/17 |
| 2005/0082515 | A1 | 4/2005 | Masuichi et al. ............. 252/500 |
| 2006/0220542 | A1 * | 10/2006 | Suh et al. ....................... 313/506 |
| 2006/0238111 | A1 | 10/2006 | Shimizu et al. .............. 313/503 |

FOREIGN PATENT DOCUMENTS

| JP | H10-289784 A | 10/1998 |
| JP | 2006285180 A | 10/2006 |
| JP | 2007026866 A | 2/2007 |

OTHER PUBLICATIONS

Bühler et al. ("Silicon dioxide sacrificial layer etching in surface micromachining", J. of Micromech. Microeng., 7, pp. R1-R13, 1997).*
Japanese Office Action issued in counterpart application No. 2007-272540 dated Apr. 18, 2013, along with its English-language translation—5 pages.
Japanese Office Action issued in counterpart application No. 2007-272540 dated Jan. 16, 2014, along with its English-language translation—5 pages.

* cited by examiner

*Primary Examiner* — Yasser A Abdelaziez
(74) *Attorney, Agent, or Firm* — Fitzpatrick, Cella, Harper & Scinto

(57) ABSTRACT

Provided is a method of manufacturing a display apparatus, including forming a drive circuit and a light-emitting portion on a substrate in which the forming the light-emitting portion includes forming a transparent anode electrode for applying a charge to an emission layer, forming a first coating layer and a second coating layer on the transparent anode electrode, removing the first coating layer by etching using the second coating layer as a mask, and forming a layer including the emission layer on a part of the transparent anode electrode from which the first coating layer is removed. A surface of the transparent anode electrode becomes as clean as a surface cleaned with ultraviolet irradiation.

8 Claims, 8 Drawing Sheets

METHOD OF MANUFACTURING DISPLAY APPARATUS

TECHNICAL FIELD

The present invention relates to a method of manufacturing a display apparatus, and more particularly, to a method of manufacturing a display apparatus, which includes a light-emitting material sandwiched between electrodes, and uses light emitted through application of an electric field to the electrodes. The above-mentioned display apparatus includes, for example, a display apparatus using an organic electroluminescence (EL) device or an inorganic EL device. It should be noted that an organic El display apparatus using the organic EL device will be mainly described herein, but is not intended to limit the scope of the present invention to only the organic El display apparatus.

BACKGROUND ART

An EL display apparatus can be classified into two types including active matrix type and passive matrix type by its driving method. The active matrix EL display apparatus is driven by a current and each matrix array pixel region thereof includes at least one thin film transistor (TFT) serving as a switching device. The thin film transistor adjusts a driving current based on a change in storage potential of a capacitor in order to control luminance and gradation of the pixel region.

Among the active matrix EL display apparatuses, an active matrix organic EL display apparatus includes, as fundamental constituent elements, an electrode layer, an organic emission layer which is formed on the electrode layer and is made of an organic EL material, and another electrode layer formed on the organic emission layer. In a case of a bottom emission type display apparatus in which light is emitted to a substrate side, a substrate and a lower electrode layer are required to be light transmissive, and thus a transparent electrode is used as the lower electrode layer. A conductive oxide material is normally used for the transparent electrode, and in some cases, a surface of the conductive oxide is contaminated by an organic substance. In such case described above, it is difficult to inject a current to the organic emission layer.

Therefore, as disclosed in US Patent Application Publication No. 2005/082515, it is necessary to perform, as a hydrophilic process, ultraviolet irradiation and surface cleaning with ozone generated by the ultraviolet irradiation immediately before the formation of the organic emission layer of the organic EL display apparatus on the transparent electrode layer, thereby removing organic contaminants from the surface of the transparent electrode.

However, when the above-mentioned method is performed as a method of cleaning the surface of the transparent electrode, there is a problem that an ultraviolet irradiation process is further required. In addition, there is another problem that a process of providing a light shielding layer is further required in order to prevent a phenomenon in which, when the thin film transistor of the matrix array pixel region is irradiated with ultraviolet light, the thin film transistor degrades, and thus does not serve as the switching device. In particular, when a channel layer of the TFT is made of an oxide semiconductor containing In, Ga, Zn, or the like, there is a case where a characteristic of the TFT significantly changes depending on an ultraviolet irradiation condition.

DISCLOSURE OF THE INVENTION

The present invention has been made to solve the above-mentioned problems. An object of the present invention is to provide a novel method of manufacturing a display apparatus, in which a process for cleaning an electrode surface of the display apparatus by ultraviolet irradiation, which complicates a manufacturing process and causes degradation in characteristics of the thin film transistor, is omitted.

According to the present invention, in order to solve the above-mentioned problems, a method of manufacturing a display apparatus includes forming a drive circuit and a light-emitting portion on a substrate, in which the forming the light-emitting portion includes:

forming an electrode for applying a charge to an emission layer;

forming a coating layer on the electrode;

removing at least a part of the coating layer; and forming a layer including the emission layer on a part of the electrode from which the portion of the coating layer is removed.

According to the method of manufacturing a display apparatus of the present invention, the process for cleaning the surface of the transparent electrode of the display apparatus by ultraviolet irradiation, which complicates the manufacturing process and causes degradation in characteristics of the thin film transistor, can be omitted. Therefore, the display apparatus can be efficiently manufactured.

Further features of the present invention will become apparent from the following description of exemplary embodiments with reference to the attached drawings.

BEST MODE FOR CARRYING OUT THE INVENTION

Hereinafter, a method of manufacturing a display apparatus in which a drive circuit and a light-emitting portion are formed on a substrate, according to the present invention will be described. Embodiment 1 is an example in which the light-emitting portion is arranged on the substrate together with the drive circuit including a thin film transistor. Embodiment 2 is an example in which the light-emitting portion is stacked on the drive circuit formed on the substrate. An example of an active matrix organic EL display apparatus of a bottom emission type will be described in detail with reference to the attached drawings.

(Embodiment 1)

Figure 1:
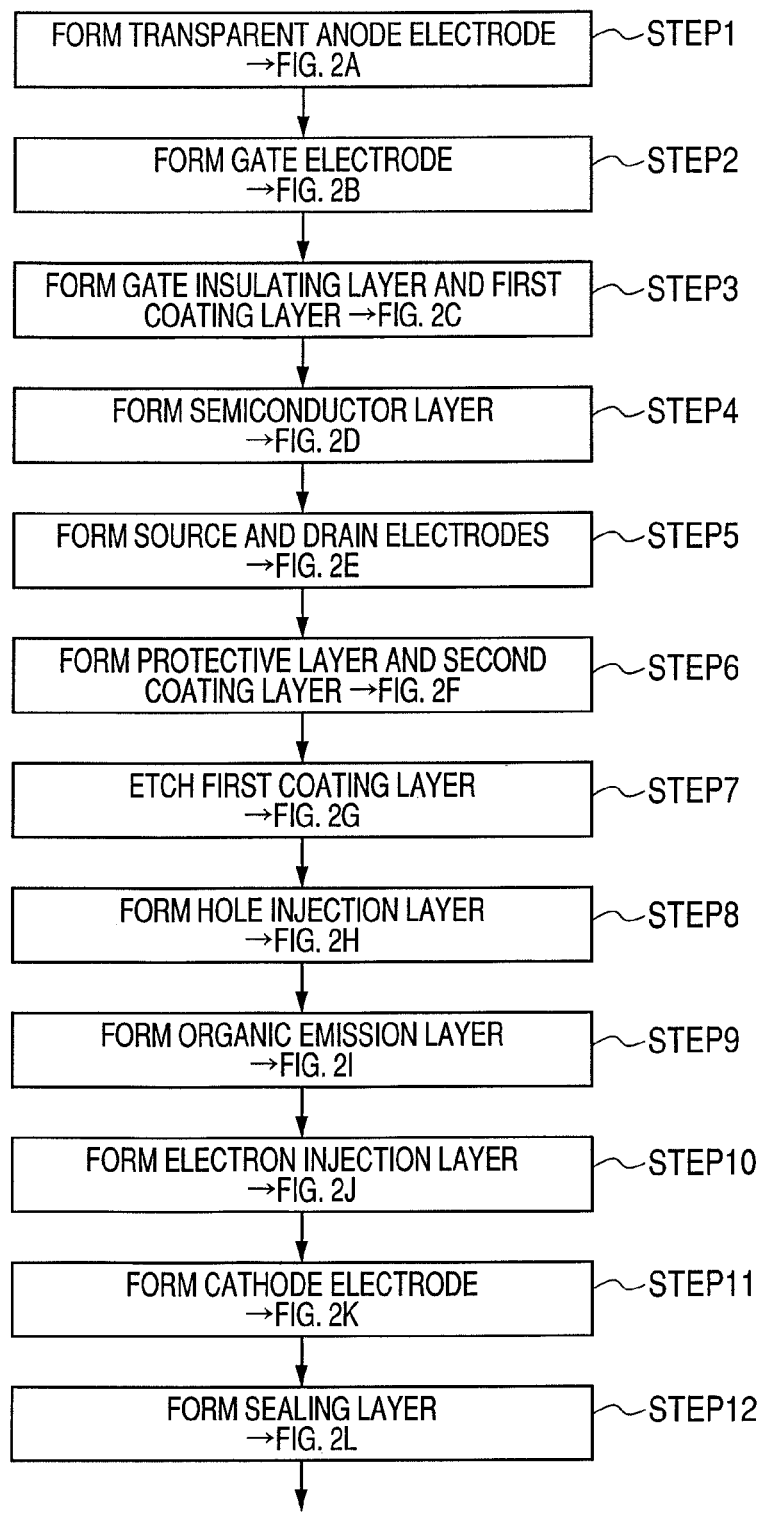
FIG. 1 is a flow chart illustrating a process for manufacturing a display apparatus according to Embodiment 1 of the present invention.

The manufacturing method includes twelve steps, and a flow thereof is illustrated in a flow chart of FIG. 1. FIGS. 2A to 2L are cross sectional views illustrating the active matrix organic EL display apparatus of the bottom emission type, which is manufactured by the manufacturing method according to the present invention.

A bottom-gate top-contact thin film transistor is illustrated in FIGS. 2A to 2L. However, the present invention is not limited to such a transistor structure, and may also be applied to, for example, a top-gate bottom-contact thin film transistor. The thin film transistor has a structure in which a gate electrode 2, a gate insulating layer 3, a semiconductor layer 4, a source electrode 5, a drain electrode 6, and a protective layer 7 are stacked on a substrate 1 in the stated order. An organic EL device has a structure in which a transparent anode electrode 8, a hole injection layer 11, an organic emission layer 12, an electron injection layer 13, and a cathode electrode 14 are stacked on the substrate 1 in the stated order. Charges are applied to the organic emission layer 12 by the transparent anode electrode 8 and the cathode electrode 14 through the hole injection layer 11 and the electron injection layer 13.

The substrate 1 is an insulating substrate. The substrate 1 is desirably, for example, a glass substrate. When an organic material such as polyethylene terephthalate (PET) or a polymer material is used for the substrate 1, the thin film transistor can be manufactured on the flexible substrate.

Figure 2A:
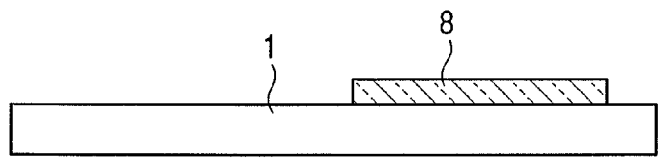
FIG. 2A illustrates formation of a transparent anode electrode in the process for manufacturing a display apparatus according to Embodiment 1 of the present invention.

First, in Step 1, a transparent conductive film is deposited on the substrate 1. It is desirable to use ITO for the transparent conductive film. Alternatively, a material including at least one of $In_2O_2$, $SnO_2$, and ZnO is desirably used for the transparent conductive film. As a film formation method for the transparent conductive film, a vapor phase method such as sputtering, pulse laser vapor deposition, or electron beam vapor deposition is desirably used. However, the film formation method is not limited to the vapor phase method. Then, the transparent conductive film is patterned to form the transparent anode electrode 8. A state described so far is illustrated in FIG. 2A.

Figure 2B:
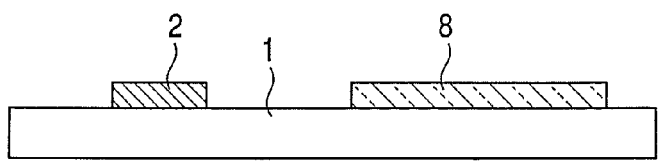
FIG. 2B illustrates formation of a transparent gate electrode in the process for manufacturing a display apparatus according to Embodiment 1 of the present invention.

Next, in Step 2, a conductive film is deposited on the substrate 1. A film containing at least one kind of metal is used as the conductive film. In addition, a conductive metal oxide ($MO_x$, where M represents metallic element) may be used. The conductive film may include a single layer or stacked multiple films. As a film formation method for the conductive film, a vapor phase method such as sputtering, pulse laser vapor deposition, or electron beam vapor deposition is desirably used. However, the film formation method is not limited to the vapor phase method. Then, the conductive film is patterned to form the gate electrode 2. Note that, when the gate electrode 2 is made of the same material as the transparent anode electrode 8, the gate electrode 2 and the transparent anode electrode 8 can be simultaneously formed. A state described so far is illustrated in FIG. 2B.

Next, in Step 3, an insulator film is deposited on the gate electrode 2 and the transparent anode electrode 8. The insulator film is made of an inorganic material selected from the group consisting of oxide, carbide, nitride, fluoride, and a compound thereof. For example, a metal oxide film containing at least one kind of metallic element is used as the insulator film. Among the metal oxides, it is more desirable to use as the insulator film a metal oxide containing at least one of the following:

$SiO_2Al_2O_3$, $Ga_2O_3$, $In_2O_3$, MgO, CaO, SrO, BaO, ZnO, $Nb_2O_5$, $Ta_2O_5$, $TiO_2$, $ZrO_2$, $HfO_2$, $CeO_2$, $Li_2O$, $Na_2O$, $K_2O$, $Rb_2O$, $Sc_2O_3$, $Y_2O_3$, $La_2O_3$, $Nd_2O_3$, $Sm_2O_3$, $Gd_2O_3$, $Dy_2O_3$, $Er_2O_3$ and $Yb_2O_3$.

Figure 2C:
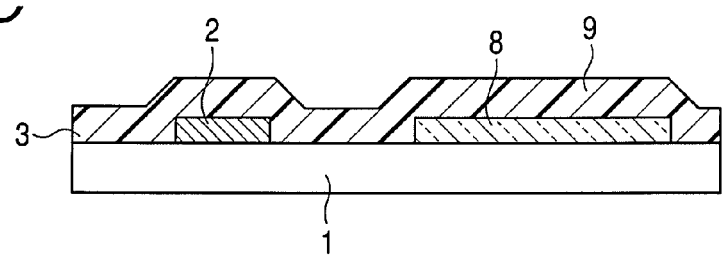
FIG. 2C illustrates formation of a gate insulating layer and a first coating layer in the process for manufacturing a display apparatus according to Embodiment 1 of the present invention.

In addition, a metal nitride ($MN_x$, where M represents metallic element) may be used. Further, a metal oxynitride ($MO_xN_y$, where M represents metallic element) may be used. As a film formation method for the insulator film, a vapor phase method such as sputtering, pulse laser vapor deposition, or electron beam vapor deposition is desirably used. However, the film formation method is not limited to the vapor phase method. Then, the insulator film is patterned to form the gate insulating layer 3 and a first coating layer 9. That is, a part of the insulator film serves as the gate insulating layer 3 and another part thereof serves as the first coating layer 9. The gate insulating layer 3 and the first coating layer 9 are derived from the insulator film which is the same layer but have different functions. Therefore, the gate insulating layer 3 and the first coating layer 9 are separately described. A state described so far is illustrated in FIG. 2C.

Next, in Step 4, a semiconductor film is deposited on the gate insulating layer 3. The semiconductor film is desirably made of one of an oxide containing ZnO as a main constituent element,
an oxide containing $In_2O_3$ as a main constituent element,
an oxide containing $Ga_2O_3$ as a main constituent element,
and an oxide containing a composite oxide including at least two of those as a main constituent element.

In particular, it is desirable to use an oxide containing $In_2O_3$ and ZnO in which a total mole ratio of $In_2O_3$ and ZnO is equal to or larger than half of a mole ratio of the entire oxide.

Figure 2D:
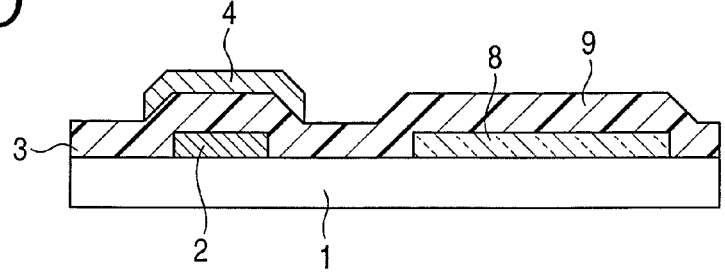
FIG. 2D illustrates formation of a semiconductor layer in the process for manufacturing a display apparatus according to Embodiment 1 of the present invention.

Alternatively, the semiconductor film can include an oxide semiconductor such as $SnO_2$ or $TiO_x$. An oxide including another oxide semiconductor may be used. As a film formation method for the semiconductor film, a vapor phase method such as sputtering, pulse laser vapor deposition, or electron beam vapor deposition is desirably used. However, the film formation method is not limited to the vapor phase method. Then, the semiconductor film is patterned to form a semiconductor layer 4. A state described so far is illustrated in FIG. 2D.

Figure 2E:
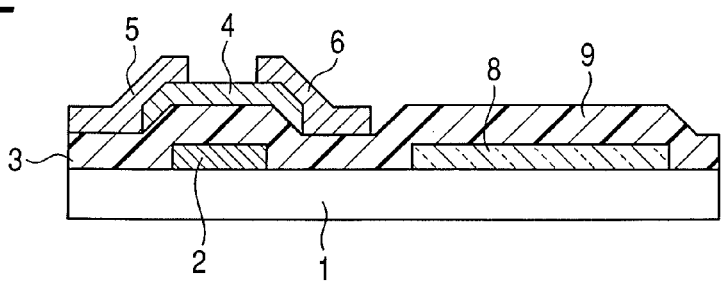
FIG. 2E illustrates formation of a source electrode and a drain electrode in the process for manufacturing a display apparatus according to Embodiment 1 of the present invention.

Next, in Step 5, a conductive film is deposited on the semiconductor layer 4. A film containing at least one kind of metal is used as the conductive film. In addition, a conductive metal oxide ($MO_x$, where M represents metallic element) may be used. The conductive film may include a single layer or stacked multiple films. As a film formation method for the conductive film, a vapor phase method such as sputtering, pulse laser vapor deposition, or electron beam vapor deposition is desirably used. However, the film formation method is not limited to the vapor phase method. Then, the conductive film is patterned to form the source electrode 5 and the drain electrode 6. Note that, when the source electrode 5 and the drain electrode 6 are made of the same material as the transparent anode electrode 8, the electrodes can be simultaneously formed. A state described so far is illustrated in FIG. 2E.

Next, in Step 6, a second coating layer 10 is deposited on the source electrode 5, the drain electrode 6, and the first coating layer 9. The second coating layer 10 is made of an inorganic material selected from the group consisting of oxide, carbide, nitride, fluoride, and a compound thereof. For example, a metal oxide film containing at least one kind of metallic element is used as the second coating layer. Among the metal oxides, it is more desirable to use a metal oxide containing at least one of the following:

$SiO_2$, $Al_2O_3$, $Ga_2O_3$, $In_2O_3$, MgO, CaO, SrO, BaO, ZnO, $Nb_2O_5$, $Ta_2O_5$, $TiO_2$, $ZrO_2$, $HfO_2$, $CeO_2$, $Li_2O$, $Na_2O$, $K_2O$, $Rb_2O$, $Sc_2O_3$, $Y_2O_3$, $La_2O_3$, $Nd_2O_3$, $Sm_2O_3$, $Gd_2O_3$, $Dy_2O_3$, $Er_2O_3$, and $Yb_2O_3$.

Figure 2F:
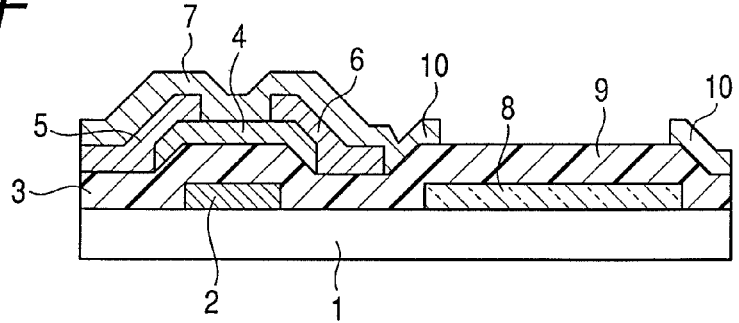
FIG. 2F illustrates formation of a protective layer and a second coating layer in the process for manufacturing a display apparatus according to Embodiment 1 of the present invention.

In addition, a metal nitride ($MN_x$, where M represents metallic element) may be used. Further, a metal oxynitride ($MO_xN_y$, where M represents metallic element) may be used. As a film formation method for the second coating layer 10, a vapor phase method such as sputtering, pulse laser vapor deposition, or electron beam vapor deposition is desirably used. However, the film formation method is not limited to the vapor phase method. Then, the second coating layer 10 is patterned to form the protective layer 7 and the second coating layer 10 having an opening portion. That is, a part of the second coating layer 10 serves as the protective layer 7 and another part thereof serves as the second coating layer 10 having the opening portion. The protective layer 7 and the second coating layer 10 are derived from the second coating layer 10 which is the same layer but have different functions. Therefore, the protective layer 7 and the second coating layer 10 are separately described. Therefore, the coating layer includes at least two coating layers such as the first coating layer 9 and the second coating layer 10, and particularly includes at least two kinds of multiple layers made of different materials. A structure illustrated in FIG. 2F is completed by the steps described above.

Figure 2G:
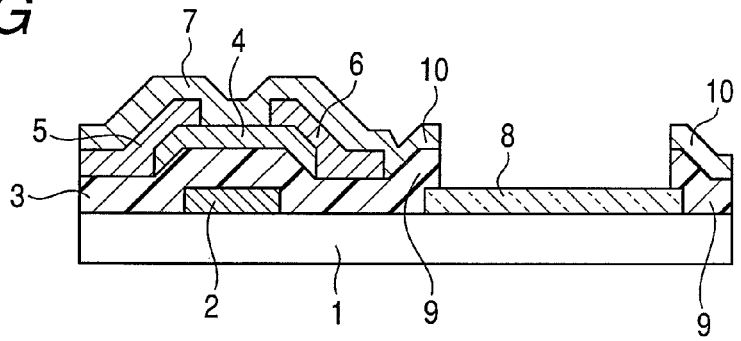
FIG. 2G illustrates etching of the first coating layer in the process for manufacturing a display apparatus according to Embodiment 1 of the present invention.

Next, in Step 7, at least a part of the first coating layer 9 is removed. That is, the second coating layer 10 having the opening portion is used as a hard mask to etch the first coating layer 9. Then, at least a part of the first coating layer 9 which is located on the transparent anode electrode 8 is removed. Etching used for the first coating layer 9 is one of dry etching and wet etching. An etching rate of the transparent anode electrode 8 against an etchant for etching the first coating layer 9 is smaller than an etching rate of the first coating layer 9. An etching rate of the second coating layer 10 against the etchant for etching the first coating layer 9 is smaller than the etching rate of the first coating layer 9. A structure illustrated in FIG. 2G is completed by the steps described above.

Figure 2H:
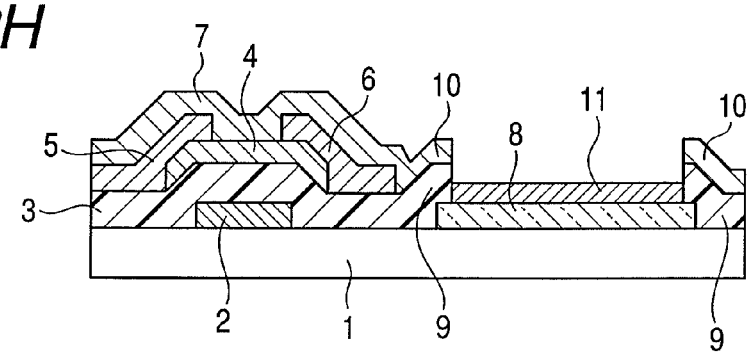
FIG. 2H illustrates formation of a hole injection layer in the process for manufacturing a display apparatus according to Embodiment 1 of the present invention.

Next, in Step 8, the hole injection layer 11 is formed on the transparent anode electrode 8. A film formation method such as sputtering, pulse laser vapor deposition, electron beam vapor deposition, spin coating, or vacuum vapor deposition is desirably used as the film formation method for the hole injection layer 11. However, the film formation method is not limited to such a method. A state described so far is illustrated in FIG. 2H.

Figure 2I:
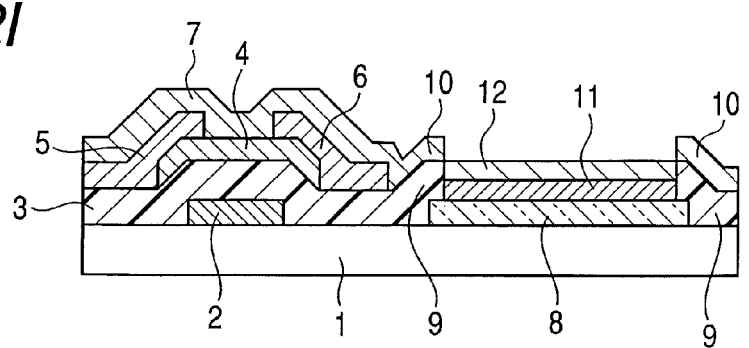
FIG. 2I illustrates formation of an organic emission layer in the process for manufacturing a display apparatus according to Embodiment 1 of the present invention.

Next, in Step 9, the organic emission layer 12 is formed on hole injection layer 11. A film formation method such as vacuum vapor deposition or coating is desirably used as the film formation method for the organic emission layer 12. However, the film formation method is not limited to such a method. A state described so far is illustrated in FIG. 2I.

Figure 2J:
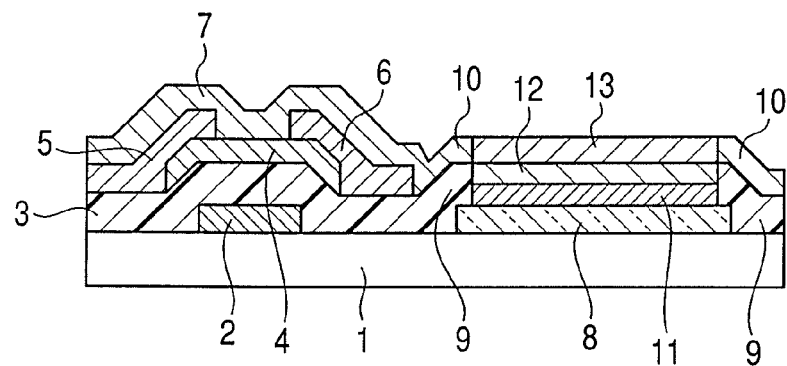
FIG. 2J illustrates formation of an electron injection layer in the process for manufacturing a display apparatus according to Embodiment 1 of the present invention.

Next, in Step 10, the electron injection layer 13 is formed on the organic emission layer 12. A film formation method such as sputtering, pulse laser vapor deposition, electron beam vapor deposition, spin coating, or vacuum vapor deposition is desirably used as the film formation method for the electron injection layer 13. However, the film formation method is not limited to such a method. A state described so far is illustrated in FIG. 2J.

Figure 2K:
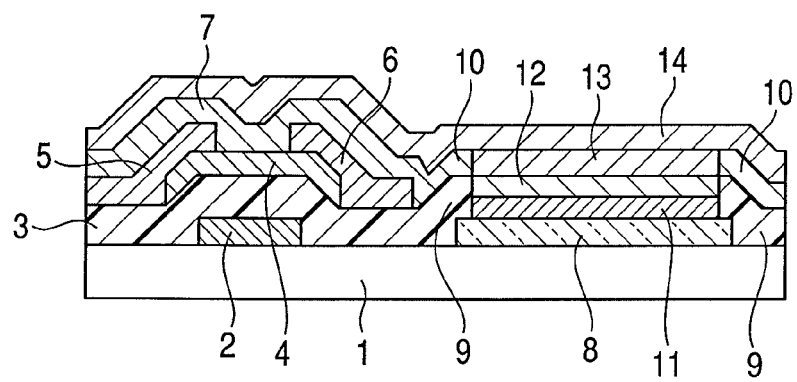
FIG. 2K illustrates formation of a cathode electrode in the process for manufacturing a display apparatus according to Embodiment 1 of the present invention.

Next, in Step 11, the cathode electrode 14 is formed on the electron injection layer 13. A film formation method such as sputtering, pulse laser vapor deposition, electron beam vapor deposition, spin coating, or vacuum vapor deposition is desirably used as the film formation method for the cathode electrode 14. However, the film formation method is not limited to such a method. A state described so far is illustrated in FIG. 2K.

Figure 2L:
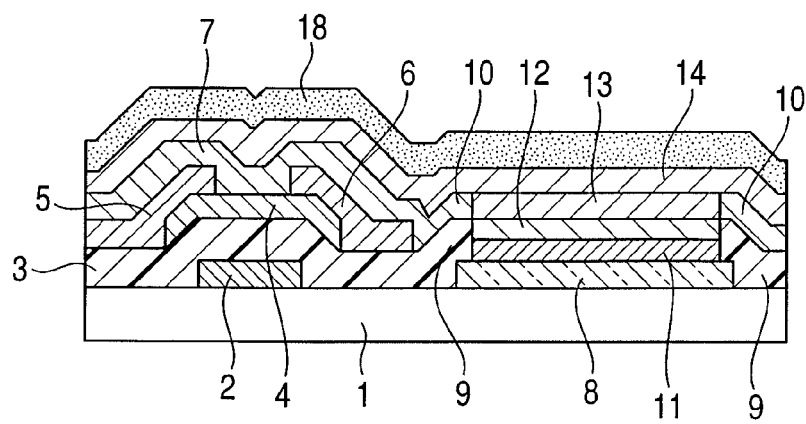
FIG. 2L illustrates formation of a sealing layer in the process for manufacturing a display apparatus according to Embodiment 1 of the present invention.

Next, in Step 12, a sealing layer 18 is formed on the cathode electrode 14. The sealing layer 18 to be used is desirably a cap made of glass having a thick film. However, a material of the sealing layer 18 is not limited to the cap. A state described so far is illustrated in FIG. 2L.

As described above, according to the present invention, the step of covering the surface of the transparent anode electrode 8 with the first coating layer 9 and the step of removing the first coating layer 9 are performed, whereby the surface of the transparent anode electrode 8 can be made clean. Therefore, in the case where the steps described above are performed, even when a cleaning process with ultraviolet irradiation is not provided, the surface of the transparent anode electrode 8 becomes as clean as the surface obtained by cleaning with ultraviolet irradiation. According to the findings of the inventors of the present invention, this may be based on the following reason. In the case where contaminants such as fine particles or oil contents are deposited onto the surface of the transparent anode electrode 8, when the surface of the transparent anode electrode 8 is covered with the first coating layer 9, the contaminants are bonded to the first coating layer 9. At this time, the contaminants are bonded to the first coating layer 9 more strongly than the surface of the transparent anode electrode 8 (or the contaminants are taken in the first coating layer 9). Then, when the first coating layer 9 is removed by etching, the contaminants are also removed together with the removal of the first coating layer 9. Thus, the surface of the transparent anode electrode 8 is a clean surface.

Further, in the present invention, the second coating layer 10 is used as the hard mask to etch the first coating layer 9. Therefore, in the step of exposing the surface of the transparent anode electrode 8, the surface of the transparent anode electrode 8 can be prevented from being contaminated by a resist or an organic solvent.

The steps of forming the first coating layer 9 and the second coating layer 10 can be performed together with the step of forming the thin film transistor. In the process described above, the example is described in which the first coating layer 9 is formed simultaneously with the gate insulating layer 3 and the second coating layer 10 is formed simultaneously with the protective layer 7. However, the steps that can be performed together are not limited to this case. The steps of forming the gate electrode 2, the semiconductor layer 4, the source electrode 5, and the drain electrode 6 can also be performed together with the steps of forming the first coating layer 9 and the second coating layer 10.

When at least one of the layers serving as the thin film transistor is formed as a stacked film, the first coating layer 9 and the second coating layer 10 can be formed simultaneously with a layer serving as the thin film transistor. (Embodiment 2)

The present invention can be applied to not only the structure in which the thin film transistor and the organic EL device are laterally provided on the substrate (Embodiment 1) but also the structure in which the thin film transistor and the organic EL device are stacked. An example of the structure in which the thin film transistor and the organic EL device are stacked will be described with reference to FIGS. 3A to 3F.

The process for forming the thin film transistor is the same as that of Embodiment 1 and thus the description thereof is omitted. The materials of the respective layers expressed by the same reference numerals as those of Embodiment 1 are identical to the materials of Embodiment 1.

Figure 3A:
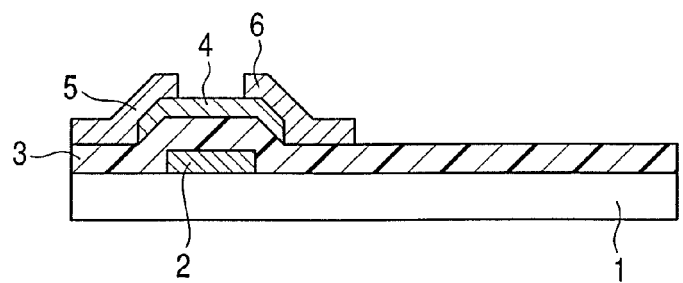
FIG. 3A illustrates formation of a thin film transistor in a process for manufacturing a display apparatus according to Embodiment 2 of the present invention.

FIG. 3A illustrates a state in which the thin film transistor is formed on the glass substrate 1. The layers serving as the thin film transistor correspond to the gate electrode 2, the gate insulating layer 3, the semiconductor layer 4, the source electrode 5, and the drain electrode 6, which are provided in the stated order from the bottom.

Figure 3B:
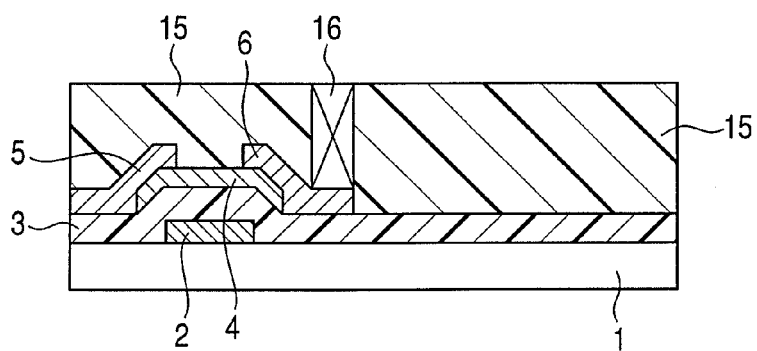
FIG. 3B illustrates formation of an interlayer insulating film, a contact hole, and a plug in the process for manufacturing a display apparatus according to Embodiment 2 of the present invention.

An interlayer insulating film 15 is formed on the thin film transistor. A part of the interlayer insulating film 15 is removed by etching to form a contact hole. The contract hole is filled with a conductive material to form a plug 16. A state described so far is illustrated in FIG. 3B.

Figure 3C:
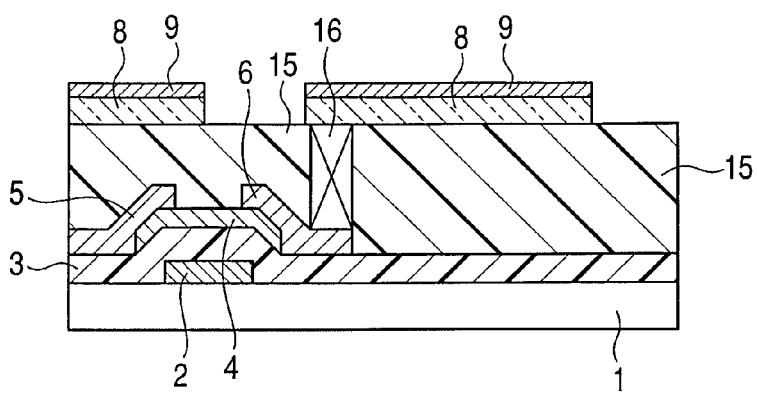
FIG. 3C illustrates formation of a transparent anode electrode and a first coating layer in the process for manufacturing a display apparatus according to Embodiment 2 of the present invention.

Then, the transparent anode electrode 8 and the first coating layer 9 are deposited on the interlayer insulating film 15 in the stated order and patterned by etching. A state described so far is illustrated in FIG. 3C.

Figure 3D:
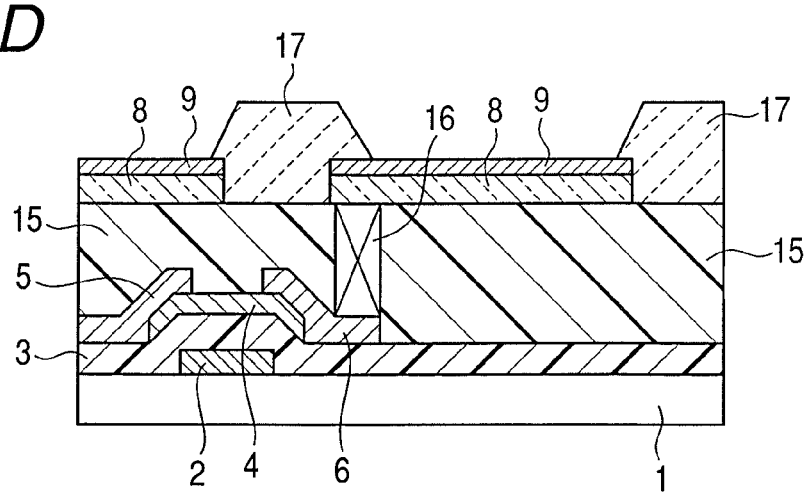
FIG. 3D illustrates formation of a partition wall in the process for manufacturing a display apparatus according to Embodiment 2 of the present invention.

Then, a partition wall 17 is formed on the transparent anode electrode 8 and the first coating layer 9. A state described so far is illustrated in FIG. 3D.

Figure 3E:
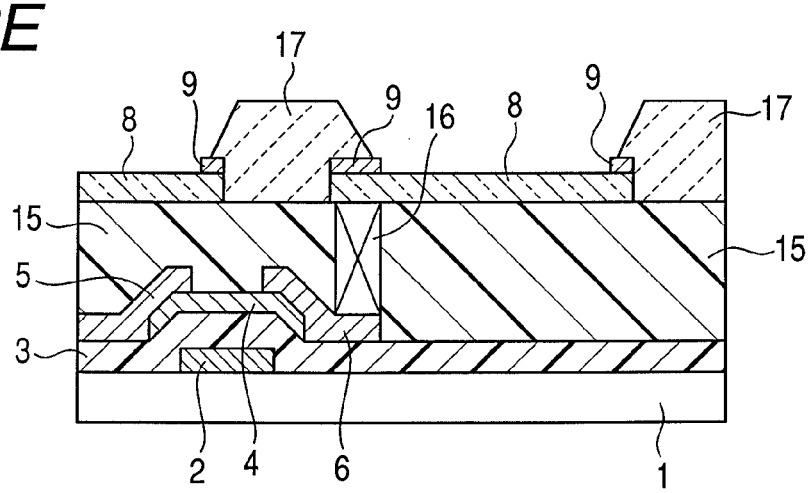
FIG. 3E illustrates etching of the first coating layer in the process for manufacturing a display apparatus according to Embodiment 2 of the present invention.

Then, the partition wall 17 is used as the hard mask to etch the first coating layer 9, thereby exposing the surface of the transparent anode electrode 8. A state described so far is illustrated in FIG. 3E. In this case, the first coating layer 9 is deposited on the transparent anode electrode 8 and then the first coating layer 9 is removed, whereby the surface of the transparent anode electrode 8 is made clean.

Figure 3F:
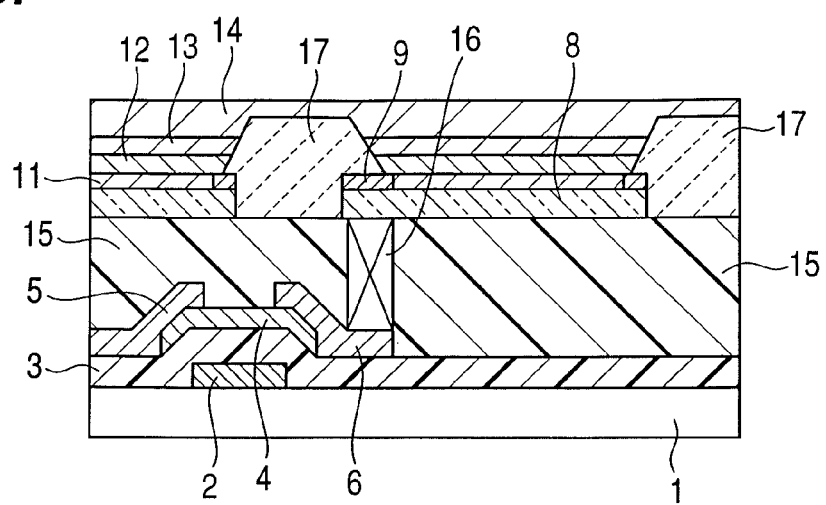
FIG. 3F illustrates formation of an organic EL layer in the process for manufacturing a display apparatus according to Embodiment 2 of the present invention.

Next, an organic EL layer is formed on the exposed transparent anode electrode 8. The organic EL layer includes the hole injection layer 11, the organic emission layer 12, and the electron injection layer 13, which are stacked in the stated order. The cathode electrode 14 is formed on the formed organic EL layer. A state described so far is illustrated in FIG. 3F. Finally, the resultant device is sealed with a glass cap.

Characteristics of a light-emitting device in the active matrix organic EL display apparatus of the bottom emission type which is manufactured as described above have no difference as compared with the case where the surface of the transparent anode electrode is subjected to cleaning treatment with ultraviolet irradiation. The thin film transistor in each pixel does not degrade by ultraviolet irradiation and thus performance and reliability can be achieved as designed in the active matrix organic EL display apparatus.

EXAMPLE

Hereinafter, Embodiment 1 of the present invention will be described in more detail with reference to an example. However, the present invention is not limited to the following example.

This example is an example in which the active matrix organic EL display apparatus of the bottom emission type as illustrated in FIG. 2L was manufactured. The thin film transistor illustrated in FIG. 2L was of the bottom-gate top-contact type and formed on the substrate 1. More specifically, the gate electrode 2, the gate insulating layer 3, the semiconductor layer 4, the source electrode 5, the drain electrode 6, and the protective layer 7 were formed on the substrate 1. The organic EL device illustrated in FIG. 2L was of the bottom emission type and formed on the substrate 1. More specifically, the transparent anode electrode 8, the first coating layer 9, the second coating layer 10, the hole injection layer 11, the organic emission layer 12, the electron injection layer 13, and the cathode electrode 14 were formed on the substrate 1.

A glass substrate (No. 1737 produced by Corning Incorporated) was used as the substrate 1. A thickness of the glass substrate was 0.5 mm.

A polycrystalline ITO thin film was formed on the substrate 1. In this example, RF magnetron sputtering using an atmosphere containing a mixture of argon gas and oxygen gas was used to form the polycrystalline ITO thin film. Then, the deposited polycrystalline ITO thin film was finely processed by photolithography and wet etching to form the gate electrode 2 and the transparent anode electrode 8.

Then, an $SiO_2$ thin film was formed on the gate electrode 2 and the transparent anode electrode 8 at a thickness of 200 nm by RF magnetron sputtering. With respect to film formation conditions, a substrate temperature was set to a room temperature, input RF power was set to 400 W, a supply flow rate of an argon gas was set to 10 sccm, and a chamber pressure was set to 0.1 Pa. The deposited $SiO_2$ thin film was patterned by photolithography and wet etching using a buffer hydrofluoric acid solution to form the gate insulating layer 3 and the first coating layer 9.

Then, an oxide semiconductor thin film containing In—Ga—Zn—O was formed on the gate insulating layer 3 at a thickness of 40 nm by RF magnetron sputtering. With respect to film formation conditions, a substrate temperature was set to a room temperature, input RF power was set to 200 W, a supply flow rate of an argon gas containing 5% of oxygen was set to 25 sccm, and a chamber pressure is set to 0.5 Pa. The formed oxide semiconductor thin film containing In—Ga—Zn—O was amorphous and a composition ratio In:Ga:Zn:O thereof was 1:1:1:4. The deposited oxide semiconductor thin film containing In—Ga—Zn—O was patterned by photolithography and wet etching using hydrochloric acid to form the semiconductor layer 4.

Then, a conductive oxide thin film containing In—Zn—O was formed on the semiconductor layer 4 at a thickness of 100 nm by RF magnetron sputtering. With respect to film formation conditions, a substrate temperature was set to a room temperature, input RF power was set to 100 W, a supply flow rate of an argon gas was set to 50 sccm, and a chamber pressure was set to 0.3 Pa. The deposited conductive oxide thin film containing In—Zn—O was finely processed by photolithography and wet etching to form the source electrode 5 and the drain electrode 6.

Then, an SiN thin film was formed on the source electrode 5, the drain electrode 6, and the first coating layer 9 at a thickness of 200 nm by RF magnetron sputtering. With respect to film formation conditions, a substrate temperature was set to a room temperature, input RF power was set to 400 W, a supply flow rate of an argon gas was set to 5 sccm, a supply flow rate of a nitrogen gas was set to 5 sccm, and a chamber pressure was set to 0.1 Pa. The deposited SiN thin film was patterned by photolithography and wet etching to form the protective layer 7 and the second coating layer 10 having the opening portion.

Then, the second coating layer 10 was used as the hard mask to remove the first coating layer 9 by wet etching using a buffer hydrofluoric acid solution, thereby exposing the surface of the transparent anode electrode 8. In this case, the surface of the transparent anode electrode 8 was in contact only with the buffer hydrofluoric acid solution and pure water for rinsing, and hence the surface thereof was not contaminated by a resist or an organic solvent.

Figure 4A:
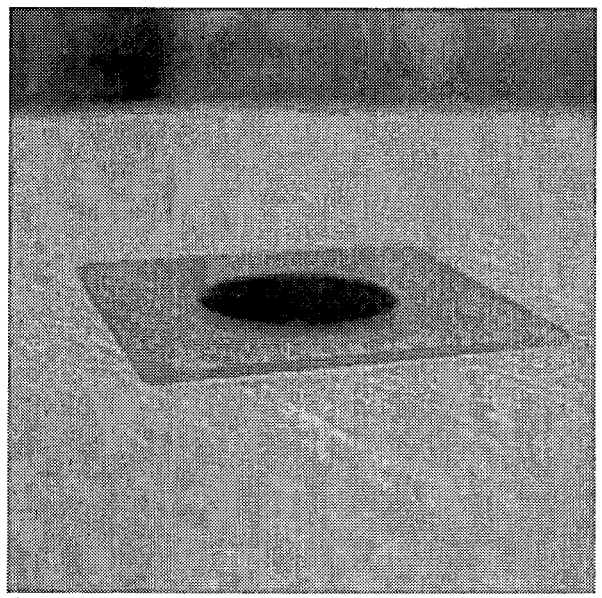
FIG. 4A is a photograph in which PEDOT:PSS is dropped on an ITO film surface cleaned by the method according to the present invention.
Figure 4B:
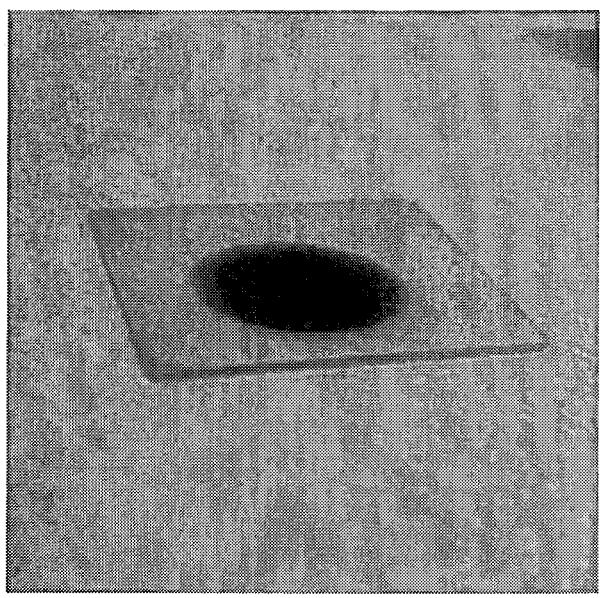
FIG. 4B is a photograph in which PEDOT:PSS is dropped on an ITO film surface cleaned by ultraviolet irradiation.
Figure 4C:
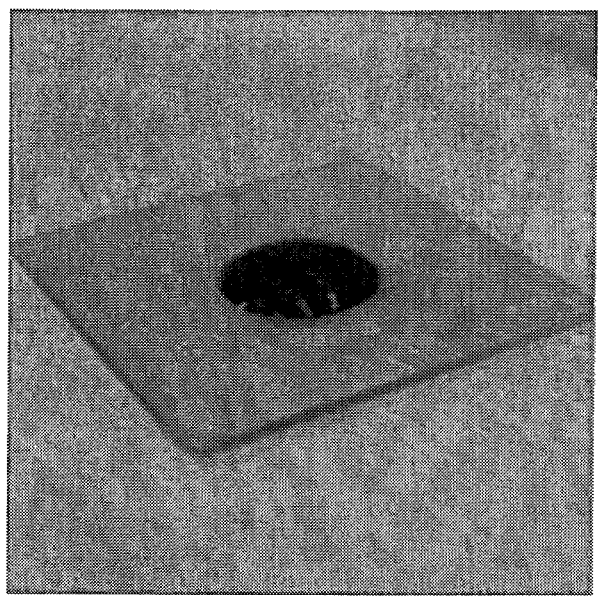
FIG. 4C is a photograph in which PEDOT:PSS is dropped on an untreated ITO film surface.

In order to check the cleanliness of the surface of the obtained transparent anode electrode, conductive polymer PEDOT:PSS [poly(3,4-ethylenedioxythiophene)-poly-(styrenesulfonate)] which was the material of the hole injection layer was dropped thereon. A state described so far is illustrated in FIG. 4A. For comparison, FIGS. 4B and 4C illustrate a state in which PEDOT:PSS was dropped on an ITO thin film subjected to cleaning treatment with ultraviolet irradiation and a state in which PEDOT:PSS was dropped on an untreated ITO thin film, respectively. It was determined that the surface of the ITO thin film which was cleaned by the method of this example had the same wettability as the surface of the ITO thin film which was cleaned by the cleaning treatment with ultraviolet irradiation, which was the conventional method. On the other hand, PEDOT:PSS on the untreated ITO thin film was a liquid droplet whose contact angle is large. This may be due to the influence of organic contamination on the surface of the ITO thin film. As is apparent from the results described above, in the case where the method of this example is employed, even when the cleaning process with ultraviolet irradiation is not provided, the ITO thin film having as clean a surface as a surface treated with ultraviolet irradiation is obtained.

Then, an organic EL layer was formed on the exposed transparent anode electrode 8. The organic EL layer was formed by stacking the hole injection layer 11, the organic emission layer 12, and the electron injection layer 13 in the stated order. The cathode electrode 14 was formed on the organic EL layer formed as described above. Finally, the resultant device was sealed with a glass cap.

Characteristics of a light-emitting device in the active matrix organic EL display apparatus of the bottom emission type which was manufactured as described above have no difference as compared with the case where the surface of the ITO thin film was subjected to cleaning treatment with ultraviolet irradiation. The thin film transistor in each pixel did not degrade by ultraviolet irradiation and thus performance and reliability could be achieved as designed in the active matrix organic EL display apparatus.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2007-272540, filed Oct. 19, 2007, which is hereby incorporated by reference herein in its entirety.

The invention claimed is:

1. A method of manufacturing a display apparatus comprising forming a drive circuit having a semiconductor layer and a light-emitting portion on a substrate, the method comprising the steps of:
   forming an anode electrode of the light-emitting portion and a gate electrode of the drive circuit on a surface of the substrate;
   forming a first insulating layer on the anode electrode and the gate electrode;
   forming the semiconductor layer on the first insulating layer;
   forming a source electrode and a drain electrode on the semiconductor layer;
   forming a second insulating layer on the source and the drain electrodes;
   removing at least a part of the first insulating layer so that an opening portion is formed on a part of the anode electrode; and
   forming an emission layer on the part of the anode electrode and into the opening portion,
   wherein the removing of at least a part of the first insulating layer is performed by using the second insulating layer as a mask.

2. The method of manufacturing a display apparatus according to claim 1, wherein the first insulating layer is formed by sputtering.

3. The method of manufacturing a display apparatus according to claim 1, wherein the removing the at least a part of the first insulating layer comprises one of wet etching and dry etching.

4. The method of manufacturing a display apparatus according to claim 3, wherein an etching rate of the anode electrode with respect to an etchant for etching the first insulating layer is smaller than an etching rate of the first insulating layer.

5. The method of manufacturing a display apparatus according to claim 1, wherein the first insulating layer is formed simultaneously with any one of the gate electrode, a gate insulating layer, the semiconductor layer, the source electrode, the drain electrode and a protective layer of a thin film transistor serving as the drive circuit.

6. The method of manufacturing a display apparatus according to claim 1, wherein an etching rate of the second insulating layer with respect to an etchant for etching the first insulating layer is smaller than an etching rate of the first insulating layer.

7. The method of manufacturing a display apparatus according to claim 1, wherein the light-emitting portion is arranged on the substrate together with the drive circuit.

8. The method of manufacturing a display apparatus according to claim 1, wherein the light-emitting portion comprises an organic electroluminescence device.

* * * * *